United States Patent
Lee et al.

(10) Patent No.: US 11,935,969 B2
(45) Date of Patent: Mar. 19, 2024

(54) PHOTODETECTOR WITH MODIFIED REGION IN BARRIER AND ABSORPTION STRUCTURES

(71) Applicant: EPISTAR CORPORATION, Hsinchu (TW)

(72) Inventors: Shih-Chang Lee, Hsinchu (TW); Shiuan-Leh Lin, Hsinchu (TW); I-Hung Chen, Hsinchu (TW); Chu-Jih Su, Hsinchu (TW); Chao-Shun Huang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 605 days.

(21) Appl. No.: 17/092,674

(22) Filed: Nov. 9, 2020

(65) Prior Publication Data

US 2021/0151612 A1   May 20, 2021

(30) Foreign Application Priority Data

Nov. 18, 2019   (TW) ................................ 108141799

(51) Int. Cl.
*H01L 31/0216*   (2014.01)
*H01L 31/0203*   (2014.01)

(52) U.S. Cl.
CPC .... *H01L 31/02162* (2013.01); *H01L 31/0203* (2013.01)

(58) Field of Classification Search
CPC ...................... H01L 31/02162; H01L 31/0203
See application file for complete search history.

(56) References Cited

U.S. PATENT DOCUMENTS

| | | | |
|---|---|---|---|
| 9,755,090 B2 * | 9/2017 | Portier | H01L 31/035209 |
| 10,297,708 B1 * | 5/2019 | Ariyawansa | H01L 31/1868 |
| 10,629,774 B2 * | 4/2020 | Oh | H01L 33/14 |

(Continued)

FOREIGN PATENT DOCUMENTS

| | | | |
|---|---|---|---|
| CN | 105140330 B | | 3/2017 |
| CN | 109148636 A | * | 1/2019 |

(Continued)

OTHER PUBLICATIONS

Michael Verdun et al. "Dark current investigation in thin P-i-N InGaAs photodiodes for nano-resonators", Journal of Applied, Physics, American Institute of Physics (US), 2016, 120 (8),084501; pp. 1-10.

*Primary Examiner* — Lex H Malsawma
(74) *Attorney, Agent, or Firm* — Muncy, Geissler, Olds & Lowe, P.C.

(57) ABSTRACT

A photodetector includes a first semiconductor layer, an absorption structure, a second semiconductor layer, and a barrier structure. The absorption structure is located on the first semiconductor layer, and having a first conduction band, a first valence band, and a first band gap. The second semiconductor layer is located on the absorption structure, and having a second conduction band, a second valence band, and a second band gap. The barrier structure is located between the absorption structure and the second semiconductor layer, and having a third conduction band, a third valence band, and a third band gap. The third conduction band is greater than the second conduction band or the third valence band is less than the second valence band.

19 Claims, 4 Drawing Sheets

(56) References Cited

U.S. PATENT DOCUMENTS

| | | | |
|---|---|---|---|
| 2002/0105010 A1* | 8/2002 | Ono | H01L 31/1035 |
| | | | 257/E31.059 |
| 2002/0117657 A1* | 8/2002 | Moll | H01L 29/7371 |
| | | | 257/E29.189 |
| 2004/0119093 A1* | 6/2004 | Cohen | H01L 31/02327 |
| | | | 257/200 |
| 2009/0078859 A1* | 3/2009 | Wong | H01L 24/97 |
| | | | 257/E21.04 |
| 2011/0101306 A1* | 5/2011 | Akita | H01L 31/035236 |
| | | | 257/434 |
| 2011/0210313 A1* | 9/2011 | Fujii | H01L 31/1844 |
| | | | 438/94 |
| 2014/0054545 A1* | 2/2014 | Akita | H01L 31/105 |
| | | | 438/87 |
| 2014/0191195 A1* | 7/2014 | Sundaram | H01L 31/022408 |
| | | | 438/73 |
| 2018/0062033 A1* | 3/2018 | Chen | H01L 33/10 |
| 2018/0108805 A1* | 4/2018 | Shatalov | H01L 33/0075 |
| 2019/0019907 A1* | 1/2019 | Suzuki | H01L 21/02507 |
| 2019/0157338 A1* | 5/2019 | Reverchon | H01L 27/14689 |

FOREIGN PATENT DOCUMENTS

| | | |
|---|---|---|
| EP | 0901170 A1 | 3/1999 |
| KR | 20170143287 A * | 12/2017 |

\* cited by examiner

US 11,935,969 B2

PHOTODETECTOR WITH MODIFIED REGION IN BARRIER AND ABSORPTION STRUCTURES

CROSS REFERENCE TO RELATED APPLICATIONS

This application claims the right of priority based on TW Application Serial No. 108141799, filed on Nov. 18, 2019, and the content of which is hereby incorporated by reference in its entirety.

FIELD OF DISCLOSURE

The present disclosure relates to a photodetector, and particularly to a photodetector having a barrier structure to block carrier flow.

BACKGROUND OF THE DISCLOSURE

The descriptions herein merely provide background information related to the present disclosure and do not necessarily constitute prior arts.

With the development of science and technology, the application of detectors has become wider, such as household, automobile, medical, and consumer electronics. Nowadays, most of the detectors adopt optical multilayers that can filter the light noise and make the detectors respond accurately to the light with a specific wavelength. The improvements to exclude the light noise effectively and to increase the accuracy of the photodetector are important topics for researchers to date.

SUMMARY OF THE DISCLOSURE

A photodetector includes a first semiconductor layer, an absorption structure, a second semiconductor layer, and a barrier structure. The absorption structure is located on the first semiconductor layer and the second semiconductor layer is located on the absorption structure. The barrier structure is located between the absorption structure and the second semiconductor layer. The absorption structure has a first conduction band, a first valence band and a first band gap. The second semiconductor has a second conduction band, a second valence band, and a second band gap. The barrier structure has a third conduction band, a third valence band, and a third band gap, wherein the third conduction band is greater than the second conduction band or the third valence band is less than the second valence band.

DETAILED DESCRIPTION OF THE DISCLOSURE

Figure 1A:
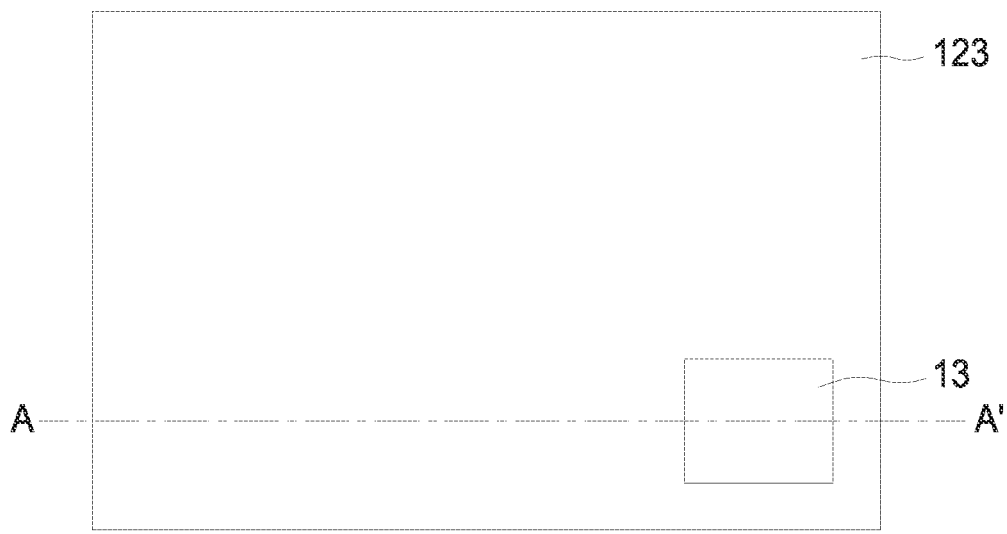
FIG. 1A shows a top view of a photodetector disclosed in one embodiment in accordance with the present disclosure.

The embodiments in accordance with the present disclosure are described in detail below with reference to the drawings. In the descriptions of the specification, specific details are provided for a full understanding of the present disclosure. The same or similar elements in the drawings are denoted by the same or similar symbols. It is noted that the drawings are for illustrative purposes only and do not represent the actual shapes, thicknesses, or heights of the elements, which can be enlarged or narrowed in a reasonable range. The embodiments in accordance with the present disclosure are simply for the illustration, but are not for limitation. Any obvious modifications or replacements of the present disclosure are not excluded from the purpose and the scope of the present disclosure.

Besides, the embodiments below can incorporate with other layers/structures or steps. For example, the description of "the second layer/structure can be formed on the first layer/structure" can include the meaning that the first layer/structure directly contacts the second layer/structure, or the first layer/structure indirectly contacts the second layer/structure, i.e., there is another layer located between the first layer/structure and the second layer/structure. Moreover, the spatial relationship of the first layer/structure and the second layer/structure can be adjusted according to the operation or usage of a device. On the other hand, the different embodiments in the present disclosure can include the same numbers and/or alphabets. The same numbers and/or alphabets are for simplification and clarification, not for the relationship illustrative among the embodiments.

Figure 1B:
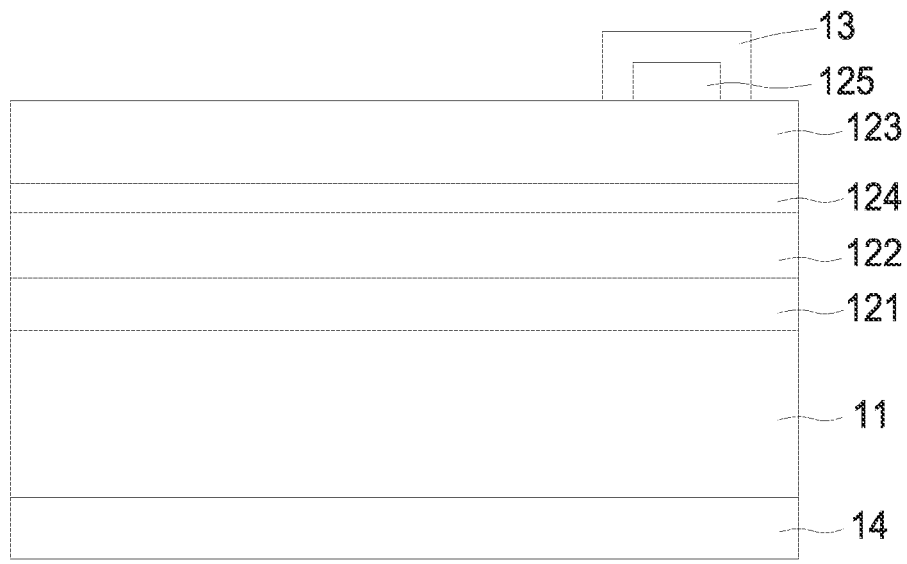
FIG. 1B shows a cross-sectional diagram taken along a line AA of FIG. 1A.

FIG. 1A shows a top view of one embodiment of a photodetector 100 in accordance with one embodiment of the present disclosure. FIG. 1B shows a cross-sectional diagram taken along a line AA' of FIG. 1A. The photodetector 100 can absorb light and convert the light into electricity or photocurrent. In one embodiment, the photodetector 100 can be a photodiode. The photodetector 100 includes a base 11, a first semiconductor layer 121, an absorption structure 122, a second semiconductor layer 123, a first electrode 13, and a second electrode 14. The base 11 can support the structure(s) on it. The absorption structure 122 is located between the first semiconductor layer 121 and the second semiconductor layer 123. The first electrode 13 and the second electrode 14 are adopted for the electrical connection of the first semiconductor layer 121, the absorption structure 122, and the second semiconductor layer 123 to conduct the photocurrent generated by the light absorption of the photodetector 100. The first electrode 13 and the second electrode 14 are located on two opposite sides of the base 11 to form a vertical type photodetector 100. In another embodiment, the first electrode 13 and the second electrode 14 can be located on the same side of the base 11 to form a horizontal type or flip-chip type photodetector 100.

The first semiconductor layer 121 and the second semiconductor layer 123 include doped semiconductors, which can have different or the same conductivity type (n-type or p-type) by implanting certain dopants. The semiconductor layer is p-type when the majority carriers are holes, and is n-type when the majority carriers are electrons. The absorption structure 122 includes doped, un-doped, or un-intentionally doped semiconductor layer/structure. The dopants can be Mg, C, Zn, Si, Se, Te, etc.

The absorption structure 122 is a light absorption region of the photodetector 100, and the wavelength of the light to be absorbed depends on the material of the absorption structure 122, namely, the absorption structure 122 can absorb the light with greater energy than its band gap. The band gap of the absorption structure 122 can be designed between 0.72 eV and 1.77 eV (corresponding to the infrared light with a wavelength between 700 nm and 1700 nm), between 1.77 eV and 2.03 eV (corresponding to the red light with a wavelength between 610 nm and 700 nm), between 2.1 eV and 2.175 eV (corresponding to the yellow light with a wavelength between 570 nm and 590 nm), between 2.137 eV and 2.48 eV (corresponding to the green light with a wavelength between 500 nm and 580 nm), between 2.53 eV and 3.1 eV (corresponding to the blue or deep blue light with a wavelength between 400 nm and 490 nm), or between 3.1 eV and 4.96 eV (corresponding to the ultra-violate light with a wavelength between 250 nm and 400 nm).

The photodetector 100 can include multi-quantum-well structure, single heterostructure, or double heterostructure. The first semiconductor layer 121, the second semiconductor layer 123, and the absorption structure 122 include III-V compound semiconductors, such as GaAs, InP, InGaAs, AlGaAs, AlGaInAs, GaP, InGaP, AlInP, AlGaInP, GaN, InGaN, AlGaN, AlGaInN, AlAsSb, InGaAsP, InGaAsN or AlGaAsP.

In embodiments in accordance with the present disclosure, if not specially mention, the above-mentioned chemical formulas include "stoichiometric compounds" and "non-stoichiometric compounds". A "stoichiometric compound" is, for example, a compound in which the total number of atoms of III-group elements is the same as the total number of atoms of V-group elements. On the contrary, a "non-stoichiometric compound" is, for example, a compound in which the total number of atoms of III-group elements is different from the total number of atoms of V-group elements. For example, a compound has a chemical formula of AlGaAs represents that the compound includes Al and/or Ga as III-group elements, and As as V-group element, wherein the total number of atoms of the III-group elements (Al and/or Ga) and the total number of atoms of the V-group elements (As) can be the same or different.

In addition, when the above-mentioned compounds represented by the chemical formulas are stoichiometric compounds, AlGaAs represents for $Al_{x1}Ga_{(1-x1)}As$, wherein $0<x1<1$; AlInP represents for $Al_{x2}In_{(1-x2)}P$, wherein $0<x2<1$; AlGaInP represents for $(Al_{y1}Ga_{(1-y1)})_{(1-x3)}In_{x3}P$, wherein $0<x3<1$, and $0<y1<1$; AlGanAs represents for $(Al_{y2}Ga_{(1-y2)})_{(1-x4)}In_{x4}As$, wherein $0\le x4\le 1$, and $0\le y2\le 1$; AlGaN represents for $Al_{x5}Ga_{(1-x5)}N$, wherein $0<x5<1$; AlAsSb represents for $AlAs_{x6}Sb_{(1-x6)}$, wherein $0\le x6\le 1$; InGaP represents for $In_{x7}Ga_{(1-x7)}P$, wherein $0<x7<1$; InGaAsP represents for $In_{x8}Ga_{(1-x8)}As_{(1-y3)}P_{y3}$, wherein $0\le x8\le 1$, and $0\le y3\le 1$; InGaAsN represents for $In_{x9}Ga_{(1-x9)}As_{(1-y4)}N_{y4}$, wherein $0<x9<1$, and $0<y4<1$; AlGaAsP represents for $Al_{x10}Ga_{(1-x10)}As_{(1-y5)}P_{y5}$, wherein $0<x10<1$, and $0<y5<1$; InGaAs represents for $In_{x11}Ga_{(1-x11)}As$, wherein $0<x11<1$; InGaN represents for $In_{x12}Ga_{(1-x12)}N$, wherein $0<x12<1$; AlGaInN represents for $(Al_{y6}Ga_{(1-y6)})_{(1-x13)}In_{x13}P$, wherein $0<x3<1$, and $0<y6<1$; AlInAs represents for $Al_{x14}In_{(1-x14)}As$, wherein $0<x14<1$.

The base 11 can be electrically conductive materials, including metal, semiconductor, or transparent conductive material. The metal can be Cu, Al, Cr, Sn, Au, Ni, Ti, Pt, Pb, Zn, Cd, Sb, Co, or the alloy including the aforementioned materials. The semiconductor can be IV group or III-V group semiconductors which can be Si, Ge, SiC, GaN, GaP, GaAs, AsGaP, or InP. The transparent conductive material can include oxide or graphene. The oxide can be indium tin oxide (ITO), InO, SnO, cadmium tin oxide (CTO), antimony tin oxide (ATO), Al-doped ZnO (AZO), zinc tin oxide (ZTO), Ga-doped ZnO (GZO), indium tungsten oxide (IWO), or indium zinc oxide (IZO). The base 11 can be a growth substrate or a bonding substrate. If the base 11 is a growth substrate, the first semiconductor layer 121, the absorption structure 122, and the second semiconductor layer 123 can be grown on the base 11 by Metal-Organic Chemical Vapor Deposition (MOCVD), Molecular Beam Epitaxy (MBE) or Hydride Vapor Phase Epitaxy (HVPE). If the base 11 is a bonding substrate, the first semiconductor layer 121, absorption structure 122, and the second semiconductor layer 123 are grown on an another growth substrate and further bonded to base 11 by substrate transfer technique. Another growth substrate can be optionally removed. The conductivity type of the base 11 can be either n-type or p-type which is the same or different from the first semiconductor layer 121.

The first semiconductor layer 121 has a first conduction band ($E_{c1}$), a first valence band ($E_{v1}$), and a first band gap ($E_1$), which is the difference between the first conduction band $E_{c1}$ and the first valence band $E_{v1}$. The absorption structure 122 has a second conduction band ($E_{c2}$), a second valence band ($E_{v2}$), and a second band gap ($E_2$), which is the difference between the second conduction band $E_{c2}$ and the second valence band $E_{v2}$. The second semiconductor layer 123 has a third conduction band ($E_{c3}$), a third valence band ($E_{v3}$), and a third band gap ($E_3$), which is the difference between the third conduction band $E_{c3}$ and the third valence band $E_{v3}$. When a semiconductor layer has a fixed composition such as $In_{0.5}Ga_{0.5}P$, its band gap energy is a fixed value that is defined as the band gap (Ex). In some situations, a semiconductor layer has a gradient composition and the interface cannot be verified by scanning electron microscope (SEM) and the semiconductor layer is regarded as a single layer with band gap energy in a range. In one embodiment, the gradient composition semiconductor layer is able to block the electrons or holes while the greatest value in the band gap energy range is defined as the band gap E. The gradient composition indicates one element in the semiconductor layer increases or decreases gradually along a growth direction of the semiconductor layer. For example, a semiconductor layer includes $In_aGa_{(1-a)}P$, wherein $0.1<a<0.3$, and In element increases gradually from 0.1 to 0.3 along the growth direction thereof. For a semiconductor structure including multiple semiconductor layers that can block the electrons or holes, such as the barrier structure 124, the band gap $E_x$ of the semiconductor structure is defined as the greatest value of the semiconductor layers in the semiconductor structure. In one embodiment, the absorption structure 122, can include a single layer or multiple layers. When the absorption structure 122 is a single layer with a gradient composition, the lowest value in the range of the band gap energy of the semiconductor layer is defined as the second band gap $E_2$. When the absorption structure 122 includes multiple layers, the lowest value in the range of the band gap energy of the multiple semiconductor layers is defined as the second band gap $E_2$. The band gap definition of the absorption structure 122 can be also applied to the first semiconductor layer 121 and the second semiconductor layer 123.

The incident light entering the photodetector 100 from the second semiconductor layer 123. In the present embodiment, the third band gap $E_3$ is greater than the second band gap $E_2$, when the energy of the incident light is less than the third band gap $E_3$ and greater than the second band gap $E_2$, the incident light is absorbed by the absorption structure 122 after passing through the second semiconductor layer 123 and further generate electron-hole pairs to form photocurrent in the electric field. When the incident energy is greater than the third band gap $E_3$, the incident light is absorbed by the second semiconductor layer 123 to generate electron-hole pairs. In other words, when the incident light has a first light with a first wavelength range and a second light with a second wavelength range, and the second wavelength range is less than the first wavelength range, namely, the photon energy of the second light ($En_2$) is greater than that of the first light ($En_1$). Furthermore, the photon energy of the first light $En_1$ is less than the third band gap $E_3$ and greater than the second band gap $E_2$, the photon energy of the second light $En_2$ is greater than the third band gap $E_3$. When the incident light casts on the photodetector 100, the second semiconductor layer 123 absorbs the second light with the second wavelength range, and the first light with the first wavelength range is absorbed by the absorption structure 122 after passing through the second semiconductor layer 123.

The photodetector 100 can additionally include a barrier structure 124, which can be grown by epitaxial methods, between the absorption structure 122 and the second semiconductor layer 123. The barrier structure 124 has a fourth conduction band $E_{c4}$, a fourth valence band $E_{v4}$ and a fourth band gap $E_4$, which is the difference between the fourth conduction band $E_{c4}$ and the fourth valence band $E_4$. The fourth band gap $E_4$ is greater than the third band gap $E_3$ and also greater than the second band gap $E_2$. Thus, it is suitable for blocking the flow of the carrier and to reduce the photocurrent generated by the electron-hole pairs flowing in the electrical field, which is not generated from the absorption structure 122, and further enhances the accuracy of the photodetector 100. In particular, the electron-hole pairs are formed because the second semiconductor layer 123 is able to absorb the second light in the second wavelength range, and the electron-hole pairs (carriers) flow to form photocurrent in the effect of the electrical field. By the configuration of the barrier structure 124, the barrier structure 124 can block the carriers flowing to the first electrode 13 or/and the second electrode 14. Thus, it can make the electron-hole pairs formed from the second semiconductor layer 123 do not contribute to the photocurrent and enhances the accuracy and sensitivity of the photodetector 100. In one embodiment, the fourth band gap $E_4$ is greater than the third band gap $E_3$ by 0.05 eV~1 eV, such as 0.1 eV or 0.5 eV.

In one embodiment, when the barrier structure 124 is formed to block electrons, the fourth conduction band $E_{c4}$ of the barrier structure 124 is greater than the third conduction band $E_3$ of the second semiconductor layer 123, i.e., $E_{c4}-E_{c3}>0$, which can block electrons more efficiently. In one embodiment, when the fourth conduction band $E_{c4}$ of the barrier structure 124 is greater than the third conduction band $E_{c3}$ of the second semiconductor layer 123, the fourth band gap $E_4$ can be greater, less or equal to the third band gap $E_3$. In one embodiment, when the barrier structure 124 is formed to block holes, the fourth valence band $E_4$ of the barrier structure 124 is less than the third valence band $E_{v3}$ of the second semiconductor layer 123, i.e., $E_4-E_{v3}<0$, which can block holes more efficiently. Similarly, when the fourth valence band $E_{v4}$ of the barrier structure 124 is less than the third valence band $E_3$ of the second semiconductor layer 123, the fourth band gap E can be greater, less, or equal to the third band gap $E_3$.

In one embodiment, the first semiconductor layer 121 is an n-type semiconductor and the second semiconductor layer 123 is a p-type semiconductor. When the incident light enters the photodetector 100 through the second semiconductor layer 123, the fourth conduction band $E_{c4}$ of the barrier structure 124 is greater than the third conduction band $E_{c3}$ of the second semiconductor layer 123 so the barrier structure 124 can block the electrons from flowing to the absorption structure 122. In another embodiment, the first semiconductor layer 121 is a p-type semiconductor, and the second semiconductor layer 123 is an n-type semiconductor. When the incident light enters the photodetector 100 through the second semiconductor layer 123, the fourth valence band $E_{v4}$ of the barrier structure 124 is less than the third valence band $E_{v3}$ of the second semiconductor layer 123 so the barrier structure 124 can block the holes from flowing to the absorption structure 122.

The barrier structure 124 has a thickness between 10 nm and 1 μm, such as 50 nm, 100 nm, or 500 nm. The barrier structure 124 can be doped, un-doped, or unintentionally doped semiconductor including III-V compound semiconductor, such as AlGaInAs, AlInAs, InGaP, AlInP, or InP. The barrier structure 124 can have the same conductivity type (n-type or p-type) as that of the second semiconductor layer 123.

In one embodiment, the barrier structure 124 includes a plurality of III group elements, and the plurality of III group elements includes Al, such as AlGanAs, AlInAs, AlInP. The Al content (in atomic percent) in the plurality of III group elements ranges from 20% to 70%, such as 30%, 40% or 50%. In this way, the electron-hole pairs formed from the light absorption of the second semiconductor layer 123 tends to recombine or extinguish in the barrier structure 124 without forming photocurrent. In one embodiment, the third band gap $E_3$ of the second semiconductor layer 123 is between 1.3 eV and 1.4 eV, such as InP, which can enhance the reliability of the photodetector 100.

In the present embodiment, in a spectrum response graph showing the relation between wavelength and the external quantum efficiency (EQE) of the photodetector 100, there is a maximum EQE value ($EQE_{max}$). By the configuration of the barrier structure 124, a light with energy greater than the third band gap $E_3$ has an EQE value less than 15% of $EQE_{max}$, such as 10% or 5%. For example, the absorption structure 122 of the photodetector 100 is InGaAs, which is able to absorb the light with wavelength below 1700 nm, the photodetector 100 has a maximum EQE, and the second semiconductor layer 123 is InP which is able to absorb the light with wavelength below 900 nm. By the configuration of the barrier structure 124, the visible light, such as 500 nm, 600 nm, and 700 nm has an EQE value less than 15% of the $EQE_{max}$.

Besides, in the practical application, when the photodetector 100 is designed to absorb or detect a target light, the material of the absorption structure 122 can be selected from those materials having the second band gap $E_2$ equal or slightly less than the energy of the target light Eo (Eo*0.9≤$E_2$≤Eo). Because the target or non-target light that is greater than or equal to the second band gap $E_2$ can be absorbed by the absorption structure 122, the photodetector 100 is unable to absorb or detect the target light only. As previously mentioned, the non-target light can be filtered by the second semiconductor layer 123 because the second semiconductor layer 123 can absorb the light with the energy greater than the third band gap $E_3$ and also makes the light with the energy less than the third band gap $E_3$ penetrate. The difference ($\Delta Ed_1$) between the second band gap $E_2$ and the third band gap $E_3$($\Delta Ed_1=E_3-E_2$) fits 0.1 eV≤Δ≤$Ed_1$≤0.5 ev, which is able to enhance the practicability and the accuracy of the photodetector 100. Furthermore, by the configuration of the barrier structure 124, the photocurrent generated from the light absorption of the second semiconductor layer 123 does not influence the accuracy and the sensitivity of the photodetector 100.

In one embodiment, the first semiconductor layer 121, the absorption structure 122, the second semiconductor layer 123 and the barrier structure 124 are lattice-matched or lattice-mismatched to each other. Particularly, the first semiconductor layer 121 has a first intrinsic lattice constant, the absorption structure 122 has a second intrinsic lattice constant, the second semiconductor layer 123 has a third intrinsic lattice constant and the barrier structure 124 has a fourth intrinsic lattice constant. When the difference of the intrinsic lattice constants of two layers is not greater than 0.1%, it is defined as lattice-matched; when the difference of the intrinsic lattice constants of two layers is greater than 0.1%, it is defined as lattice-mismatched. Besides, when the absorption structure 122 is formed of a single layer, the lattice constant of the single layer is the first intrinsic lattice constant; when the absorption structure 122 is formed of multiple layers, the average (arithmetic mean) intrinsic lattice constant of those multiple layers is the first intrinsic lattice constant. The definition of intrinsic lattice constant is the lattice constant $a_0$ of the layer without any strain substantially.

Moreover, the lattice constant can be obtained by any means. For example, the lattice constant can be analyzed from the diffraction pattern by a transmission electron microscope (TEM). The lattice constant can either be found from the X-ray diffraction at 300 K or from the textbook, such as "Properties of Semiconductor Alloys: Group-IV, III-V and II-VI Semiconductors" published by John Wiley & Sons Inc. in 200).

The photodetector 100 optionally includes a contact structure 125 located between the second semiconductor layer 123 and the first electrode 13 to reduce the resistance between the second semiconductor layer 123 and the first electrode 13, which can provide a path with lower resistance for current to pass through.

Figure 2:
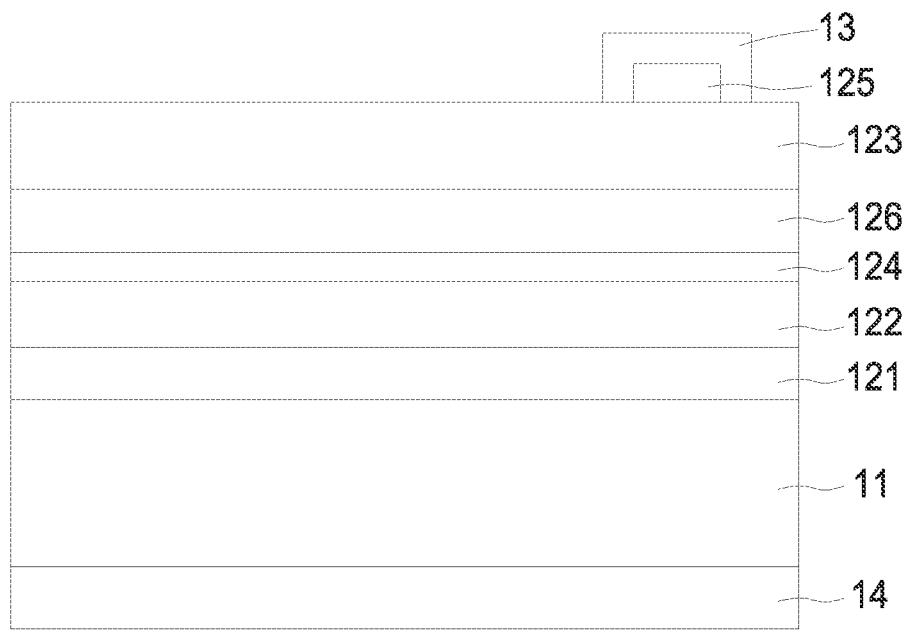
FIG. 2 shows a cross-sectional diagram of a photodetector disclosed in one embodiment in accordance with the present disclosure.

FIG. 2 shows a cross-sectional diagram of a photodetector 200 disclosed in one embodiment in accordance with the present disclosure. The photodetector 200 has similar structures with the photodetector 100. FIG. 2 has the same symbols/figures as those in FIG. 1 to describe the same components in both figures, and the materials and the properties of these components are the same as the descriptions mentioned above. The photodetector 200 additionally includes a third semiconductor layer 126 located between the barrier structure 124 and the second semiconductor layer 123, or located beneath the second semiconductor layer 123. The third semiconductor layer 126 has a fifth conduction band $E_{c5}$, a fifth valence band $E_{v5}$ and a fifth band gap $E_5$, which is the difference between the fifth conduction band $E_{c5}$ and the fifth valence band $E_{v5}$. The fifth band gap $E_5$ is less than the third band gap $E_3$ and fourth band gap $E_4$, and greater than the second band gap $E_2$. In one embodiment, the fourth conduction band $E_{c4}$ of the barrier structure 124 is greater than the fifth conduction band $E_{c5}$ of the third semiconductor layer 126 to block electrons, i.e., $E_{c4}-E_{c5}>0$. In one embodiment, the fourth valence band $E_{v4}$ of the barrier structure 124 is less than the fifth valence band $E_{v5}$ of the third semiconductor layer 126 to block holes, i.e., fourth valence band $E_{v4}-E_{v5}<0$. In one embodiment, the fifth band gap $E_5$ is greater, less, or equal to the fourth band gap $E_4$.

As previously mentioned, the second semiconductor layer 123 is able to filter a part of the non-target light, the third semiconductor layer 126 can further absorb the non-target light having energy less than the third band gap $E_3$ and greater than the fifth band gap $E_5$ and enhances the practicability and the accuracy. Besides, by the configuration of the barrier structure 124, the electron-hole pairs formed from the light absorption of the third semiconductor layer 126 is unable to flow into the absorption structure 122 through the barrier structure 124, thus the photocurrent occurrence does not happen. The band gap difference($\Delta E_{d2}$) between the second band gap $E_2$ and the fifth band gap $E_5$ ($\Delta Ed_2=E_5-E_2$) fits 0.05 eV≤$\Delta Ed_2$≤0.2 eV. The third semiconductor layer 126, the second semiconductor layer 123, and the barrier structure 124 have the same conductivity type (n-type or p-type).

In one embodiment, additional semiconductor layers can be formed between the second semiconductor layer 123 and the barrier structure 124 for absorbing the non-target light. Besides, the fourth conduction band $E_{c4}$ of the barrier structure 124 is greater than the conduction band of the layer in the additional semiconductor layers which directly contacts the barrier structure 124 to block electrons. The fourth valence band $E_{v4}$ of the barrier structure 124 is less than the valence band of the layer in the additional semiconductor layers which directly contacts the barrier structure 124 to block holes. These additional semiconductor layers, the second semiconductor layer 123 and the barrier structure 124 have the same conductivity type (n-type and p-type). In one embodiment, the band gap of these additional semiconductor layers decreases along the direction from the second semiconductor layer 123 to the barrier structure 124, not including the second semiconductor layer 123 and the barrier structure 124.

Figure 3:
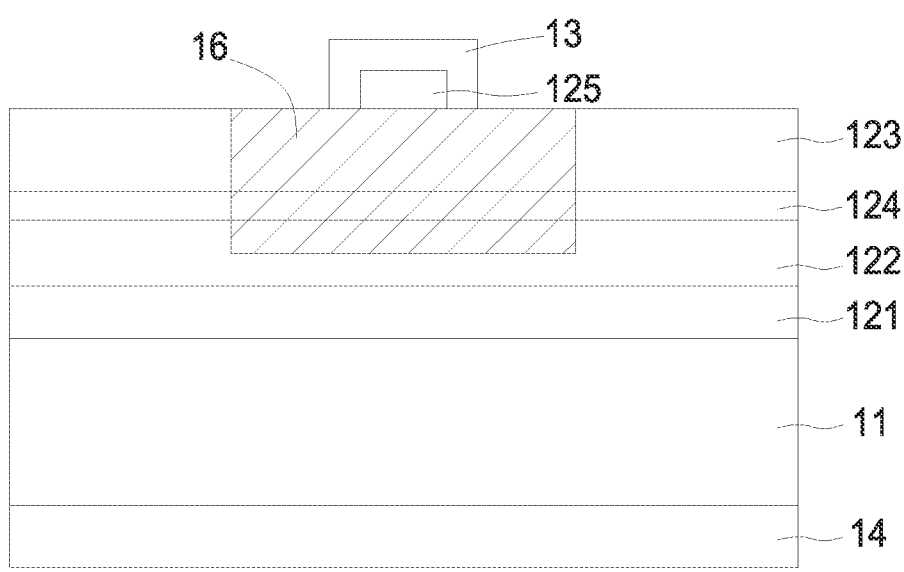
FIG. 3 shows a cross-sectional diagram of a photodetector disclosed in one embodiment in accordance with the present disclosure.

FIG. 3 shows a cross-sectional diagram of a photodetector 300 disclosed in one embodiment in accordance with the present disclosure. The photodetector 300 has similar structures with the photodetector 100. FIG. 3 has the same symbols/figures as those in FIG. 1 to describe the same components in both figures, and the materials and the properties of these components are the same as the descriptions mentioned above. The photodetector 300 additionally includes a modified region 16 formed in the second semiconductor layer 123, the barrier structure 124, and the partial absorption structure 122. More specifically, the modified region 16 is formed by adopting the ion diffusion or ion implantation to turn the majority carriers from electrons to holes or from holes to electrons in the second semiconductor layer 123, the barrier structure 124, and a region of the absorption structure 122 for changing the conductivity type or conductivity. The regions of second semiconductor layer 123, the barrier structure 124, and the absorption structure 122, which are not modified by diffusion or implantation, keep the original conductivity type or the conductivity property, and these regions are defined as unmodified regions. In the present embodiment, the second semiconductor layer 123 and the barrier structure 124 have the same conductivity type, such as n-type; the modified region 16 has a different conductivity type from that of the second semiconductor layer 123 and the barrier structure 124, such as p-type. In addition, the first semiconductor layer 121 and the second semiconductor layer 123 also have the same conductivity type, such as n-type.

Figure 4:
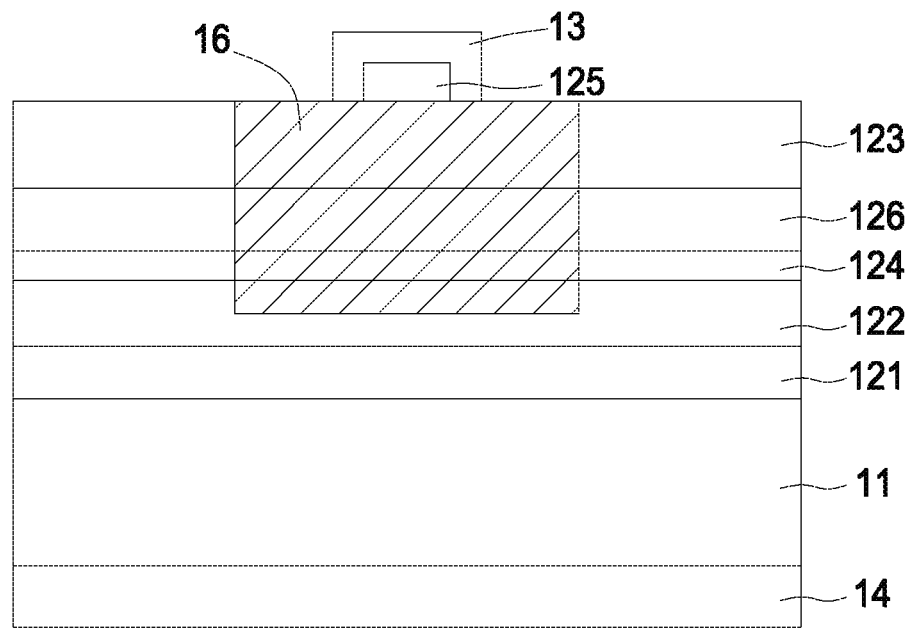
FIG. 4 shows a cross-sectional diagram of a photodetector disclosed in one embodiment in accordance with the present disclosure.

FIG. 4 shows a cross-sectional diagram of a photodetector 400 disclosed in one embodiment in accordance with the present disclosure. The photodetector 400 has similar structures with the photodetector 300. FIG. 4 has the same symbols/figures as those in FIG. 3 to describe the same components in both figures, and the materials and the properties of these components are the same as the descriptions mentioned above. The photodetector 400 additionally includes a third semiconductor layer 126 located between the barrier structure 124 and the second semiconductor layer 123, or beneath the second semiconductor layer 123. Similarly, the conductivity type of the third semiconductor layer 126 is the same as the second semiconductor layer 123, the barrier structure 124, and the absorption structure 122, and the modified region 16 is formed in the third semiconductor layer 126.

Figure 5:
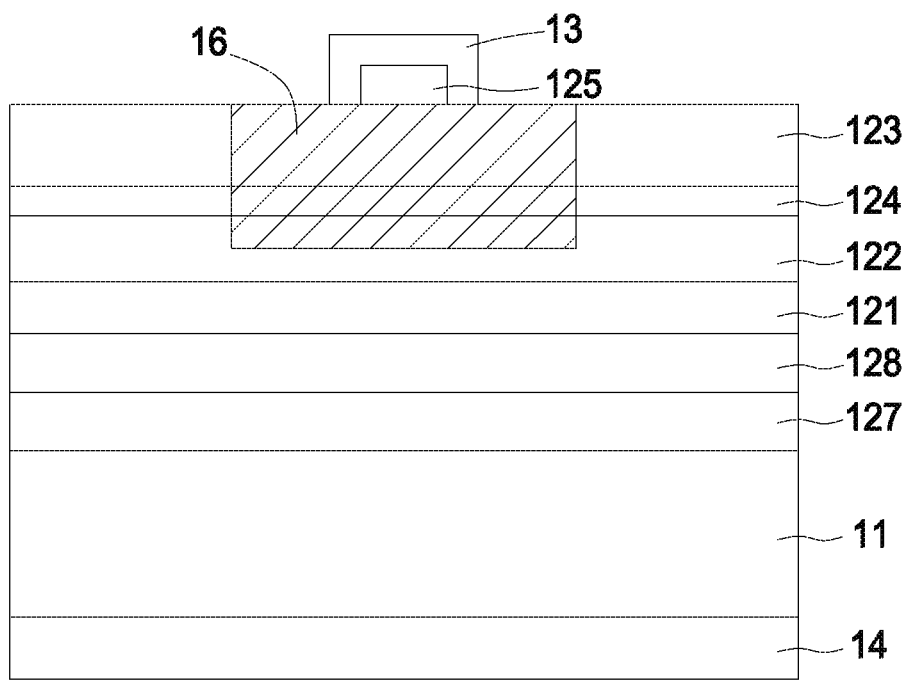
FIG. 5 shows a cross-sectional diagram of a photodetector disclosed in one embodiment in accordance with the present disclosure.

FIG. 5 shows a cross-sectional diagram of a photodetector 500 disclosed in one embodiment in accordance with the present disclosure. The photodetector 500 has similar structures with the photodetector 300. FIG. 5 has the same symbols/figures as those in FIG. 3 to describe the same components in both figures, and the materials and the properties of these components are the same as the descriptions mentioned above. The photodetector 500 additionally includes a reflection structure 127 located between the base 11 and the first semiconductor layer 121 to reflect the light, which is not completely absorbed by the absorption structure 122, backward into the absorption structure 122 and further conduct a secondary absorption in the absorption structure 122 to enhance the photoelectric conversion efficiency. Furthermore, the photodetector 500 with a reduced thickness by the configuration of the reflection structure 127 and the thinner absorption structure 122 are suitable for the small-scale application. The reflection structure 127 includes metal or alloy. The metal includes Au, Ag, Al, and Cu. The alloy includes the combination of the above-mentioned metal elements. In one embodiment, the reflection structure 127 can include a plurality of layers with different refractive indices stacking alternately to form distributed Bragg reflector (DBR), and their materials can include semiconductor, oxide, or nitride. The semiconductor includes AlGaAs. GaAs, AlAs, AlGaInP, AlInP, InGaP, InP, AlGaInAs. The oxide includes $Al_2O_3$, $SiO_2$, $TiO_2$, and $Nb_2O_5$. The nitride includes $SiN_x$.

Figure 6:
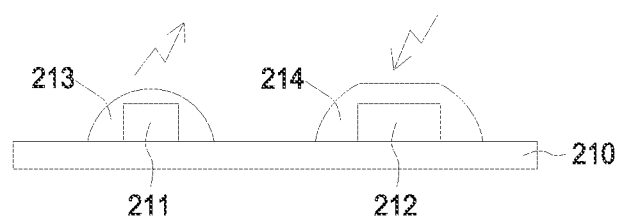
FIG. 6 shows a cross-sectional diagram of a detecting module disclosed in one embodiment in accordance with the present disclosure.

Optionally, the photodetector 500 additionally includes a bonding structure 128 located between the reflection structure 127 and the base 11. The bonding structure 128 can be a single layer or multiple layers. The bonding structure 128 can be conductive or nonconductive. When the bonding structure 128 is conductive, its material can include transparent conductive materials, metals, and alloys. The transparent conductive material includes but is not limited to indium tin oxide (ITO), InO, SnO, cadmium tin oxide (CTO), antimony tin oxide (ATO), Al-doped ZnO (AZO), zinc tin oxide (ZTO), Ga-doped ZnO (GZO), GaP, indium cerium oxide(ICO), indium tungsten oxide (IWO), indium titanium oxide (ITiO), indium zinc oxide (IZO), indium gallium oxide(IGO), gallium aluminum zinc oxide (GAZO), graphene or the combination of the above materials. The metal can include but is not limited to Cu, Al, Sn, Au, Ag, Pb, Ti, Ni, Pt, and W. The alloy includes two or more of the material selected from the above-mentioned metal. When the bonding structure 128 is nonconductive, its material can include oxide or nitride, referring to the above descriptions. FIG. 6 shows a cross-sectional diagram of one embodiment of a detecting module 20 in accordance with the present disclosure. The detecting module 20 includes a board 210, a light emitting device 211, a photo detecting device 212, a first encapsulation structure 213, and a second encapsulation structure 214. The photo detecting device 212 can be any one of the aforementioned photodetector 100~500. The light emitting device 211 and the photo detecting device 212 are located on the board 210 and connect to the electrical structure (not shown) on the board 210. The first encapsulation structure 213 covers the light emitting device 211 and the second encapsulation structure 214 covers the photo detecting device 212. The board 210 can be printed circuit board, organic matter, inorganic matter, flexible matter, or elastic matter. The organic matter can include Phenol formaldehyde resin (PF), glass-fiber reinforced thermoset polymer, epoxy, polyimide (PI), bismaleimide-triazine resin (BT). The inorganic matter can include Al or ceramic material. The flexible or elastic matter can include polyethylene terephthalate (PET). PI, polyvinylidene difluoride (PVDF), or Ethylene tetrafluoroethylene (ETFE). The first encapsulation structure 213 and the second encapsulation structure 214 include epoxy, silicone, PI, benzocyclobutene (BCB), perfluorocyclobutyl (PFCB), Su8, acrylic resin, poly(methyl methacrylate) (PMMA), PET, polycarbonate(PC) or polyetherimide.

The photo detecting device 212 is designed to detect the light emitted from the light emitting device 211. Particularly, after the light emitting device 211 emits a light, i.e., the aforementioned target light, the light is reflected toward the photo detecting device 212 and the photo detecting device 212 forms photocurrent after receiving the reflected light. The wavelength range of the light emitted from the light emitting device 211 depends on the application, for example, it can be in the range of green light, red light, or infrared light for biosensing purposes. The green light, ranging from 500 nm to 580 nm, can be applied to heart rate and blood pressure measurement. The red light, ranging from 610 nm to 700 nm, can be applied to oxygen saturation measurement. The infrared light, ranging from 700 nm to 1700 nm, can be applied to oxygen saturation, blood sugar, and blood lipid measurement.

The application of the detecting module 20 can include the products in the fields of illumination, medical treatment, display, communication, sensor, power system, such as lamps, monitors, mobile phones, tablet computers, car dashboards, TVs, computers, wearable devices (watches, bracelets, necklaces, etc.), traffic signs, outdoor displays, medical equipment.

It should be noted that the proposed various embodiments are for explanation to enable a person having ordinary skill in the art to carry out according to the disclosure but is not for the purpose to limit the scope of the disclosure. Any possible modifications without departing from the spirit of the disclosure may be made and should be covered by the disclosure.

What is claimed is:
1. A photodetector comprising:
a first semiconductor layer;
an absorption structure located on the first semiconductor layer, and having a first conduction band, a first valence band, and a first band gap;
a second semiconductor layer located on the absorption structure, and having a second conduction band, a second valence band, and a second band gap;
a barrier structure located between the absorption structure and the second semiconductor layer, and having a third conduction band, a third valence band, and a third band gap;

a modified region formed in the second semiconductor layer, the barrier structure and a part of the absorption structure;

a first electrode disposed on the second semiconductor layer; and a contact structure located between the first electrode and the second semiconductor layer, wherein the first semiconductor layer has a first conductive type and the modified region has a second conductive type different from the first conductive type, and wherein the third conduction band is greater than the second conduction band or the third valence band is less than the second valence band.

2. The photodetector of claim 1, wherein the barrier structure has a thickness between 10 nm and 50 nm.

3. The photodetector of claim 1, further comprising a base and a reflection structure located between the base and the first semiconductor layer.

4. The photodetector of claim 1, wherein the first semiconductor layer and the second semiconductor layer have the same conductivity type.

5. The photodetector of claim 1, wherein the barrier structure comprises one semiconductor selected from the group consisting of AlGaInAs, AlInAs, InGaP, AlInP, and InP.

6. The photodetector of claim 1, wherein the difference between the first band gap and the second band gap ranges from 0.1 eV to 0.5 eV.

7. The photodetector of claim 1, further comprising a third semiconductor layer located between the barrier structure and the second semiconductor layer; wherein the third semiconductor layer has a fourth conduction band, a fourth valence band, and a fourth band gap.

8. The photodetector of claim 7, wherein the fourth band gap is less than the second band gap and the third band gap, and is greater than the first band gap.

9. The photodetector of claim 7, wherein the third conduction band is greater than the fourth conduction band or/and the third valence band is less than the fourth valence band.

10. The photodetector of claim 7, wherein the modified region is further formed in the third semiconductor layer.

11. The photodetector of claim 1, wherein the barrier structure comprises a plurality of III group elements, and the plurality of III group elements comprises Al and the Al has a content in the plurality of III group elements ranging from 20% to 70%.

12. A detecting module, comprising:
a board; and
a photodetector according to claim 1 located on the board.

13. A detecting module of claim 12, further comprising an encapsulation structure covering the photodetector.

14. The photodetector of claim 1, wherein the contact structure has a sidewall covered by the first electrode.

15. The photodetector of claim 1, wherein the second semiconductor layer has a first thickness, and the contact structure has a second thickness smaller than the first thickness.

16. The photodetector of claim 1, wherein the first electrode and the contact structure contact the modified region.

17. The photodetector of claim 1, wherein the second semiconductor layer has a first thickness, and the barrier structure has a third thickness smaller than the first thickness.

18. The photodetector of claim 17, wherein the second semiconductor layer directly contacts the barrier structure.

19. The photodetector of claim 1, wherein the barrier structure has a region which is undoped.

* * * * *